US012709104B2

(12) United States Patent
Nakatani et al.

(10) Patent No.: US 12,709,104 B2
(45) Date of Patent: Aug. 18, 2026

(54) THERMAL PRINT HEAD AND METHOD FOR MANUFACTURING THERMAL PRINT HEAD

(71) Applicant: ROHM CO., LTD., Kyoto (JP)

(72) Inventors: Goro Nakatani, Kyoto (JP); Norihito Jodai, Kyoto (JP)

(73) Assignee: ROHM CO., LTD., Kyoto (JP)

(*) Notice: Subject to any disclaimer, the term of this patent is extended or adjusted under 35 U.S.C. 154(b) by 133 days.

(21) Appl. No.: 18/756,982

(22) Filed: Jun. 27, 2024

(65) Prior Publication Data

US 2025/0018730 A1 Jan. 16, 2025

(30) Foreign Application Priority Data

Jul. 10, 2023 (JP) ................................ 2023-112795

(51) Int. Cl.
*B41J 2/335* (2006.01)
*G03F 7/30* (2006.01)

(52) U.S. Cl.
CPC ......... *B41J 2/33515* (2013.01); *B41J 2/3353* (2013.01); *B41J 2/33535* (2013.01); *B41J 2/3359* (2013.01); *G03F 7/30* (2013.01); *B41J 2/3352* (2013.01)

(58) Field of Classification Search
CPC .. B41J 2/33515; B41J 2/3353; B41J 2/33535; B41J 2/3359; B41J 2/3352; B41J 2/3351; B41J 2/3355; B41J 2/3357; B41J 2/33505; G03F 7/30
See application file for complete search history.

(56) References Cited

U.S. PATENT DOCUMENTS

2006/0176359 A1* 8/2006 Yokoyama ............ B41J 2/3351 347/202
2007/0040868 A1* 2/2007 Yamade ................ B41J 2/3351 347/61

FOREIGN PATENT DOCUMENTS

JP 2022-165673 11/2022
WO WO-2021106479 A1 * 6/2021 ............. B41J 2/335

* cited by examiner

*Primary Examiner* — Henok D Legesse
(74) *Attorney, Agent, or Firm* — HSML P.C.

(57) ABSTRACT

A thermal print head includes: a substrate; an insulating layer; a wiring layer; a resistor layer; and a protective layer. The substrate has a first surface and a second surface opposite to the first surface. A raised portion protruding toward a side opposite to the second surface and extending along a first direction in a plan view is formed on the first surface. The insulating layer is disposed on the first surface. The wiring layer is disposed on the insulating layer with the resistor layer interposed therebetween. The wiring layer has a bonding pad. A constituent material of the wiring layer is aluminum or an aluminum alloy. The protective layer is disposed on the insulating layer to cover the wiring layer. An opening that exposes the bonding pad is formed in the protective layer.

4 Claims, 18 Drawing Sheets

THERMAL PRINT HEAD AND METHOD FOR MANUFACTURING THERMAL PRINT HEAD

CROSS REFERENCE TO RELATED APPLICATIONS

This nonprovisional application is based on Japanese Patent Application No. 2023-112795 filed on Jul. 10, 2024 with the Japan Patent Office, the entire contents of which are hereby incorporated by reference.

BACKGROUND OF THE INVENTION

Field of the Invention

The present disclosure relates to a thermal print head and a method for manufacturing a thermal print head.

Description of the Background Art

For example, Japanese Patent Laying-Open No. 2022-165673 (PTL 1) describes a thermal print head. The thermal print head described in PTL 1 has a substrate, an insulating layer, a wiring layer, a resistor layer, a protective layer, and a plating layer.

The insulating layer is disposed on the substrate. The wiring layer is disposed on the insulating layer with the resistor layer interposed therebetween. A constituent material of the wiring layer is copper. The wiring layer has a bonding pad. The protective layer is disposed on the insulating layer to cover the wiring layer. An opening passing through the protective layer is formed in the protective layer. The bonding pad is partially exposed from the opening. The plating layer is disposed on the bonding pad exposed from the opening. Wire bonding is performed on the bonding pad through the plating layer.

DESCRIPTION OF THE PREFERRED EMBODIMENTS

Detailed Description

Figure 1:
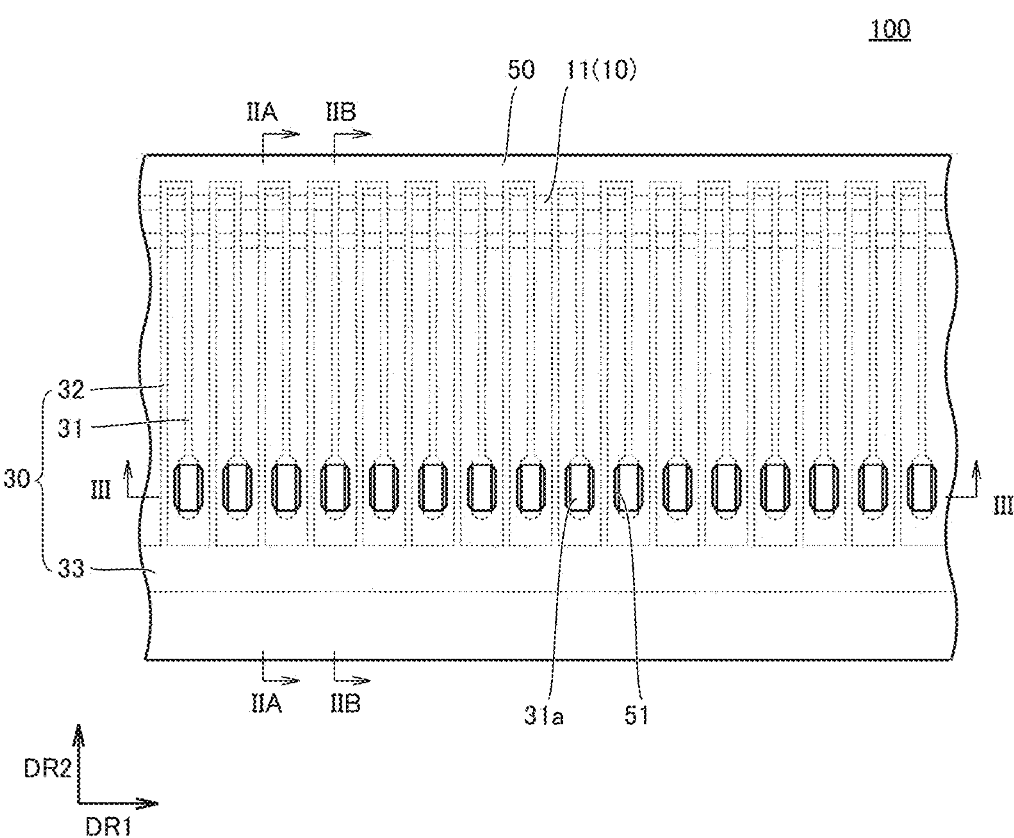
FIG. 1 is a plan view of a thermal print head 100.

Details of embodiments of the present disclosure will be described with reference to the drawings. In the following drawings, the same or corresponding portions are denoted by the same reference characters and redundant description will not be repeated. A thermal print head according to an embodiment is referred to as a thermal print head 100.

(Configuration of Thermal Print Head 100)

A configuration of thermal print head 100 will be described below.

Figure 2A:
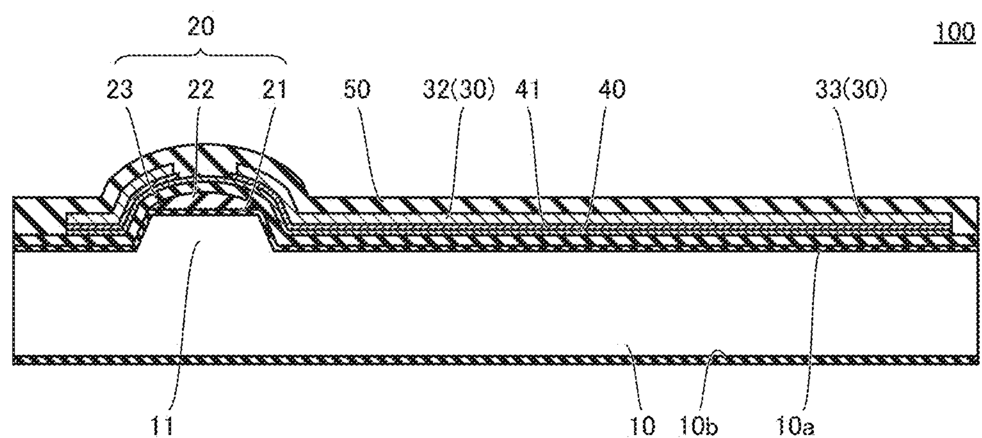
FIG. 2A is a cross-sectional view taken along IIA-IIA in FIG. 1.
Figure 2B:
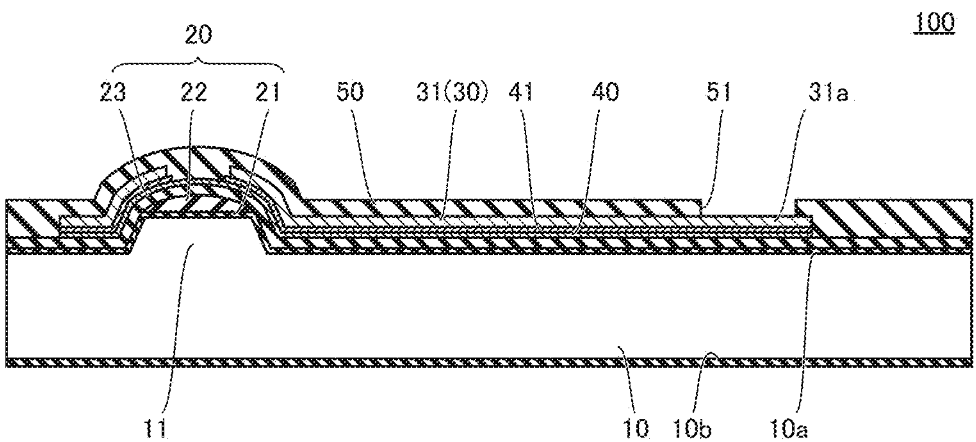
FIG. 2B is a cross-sectional view taken along IIB-IIB in FIG. 1.
Figure 3:
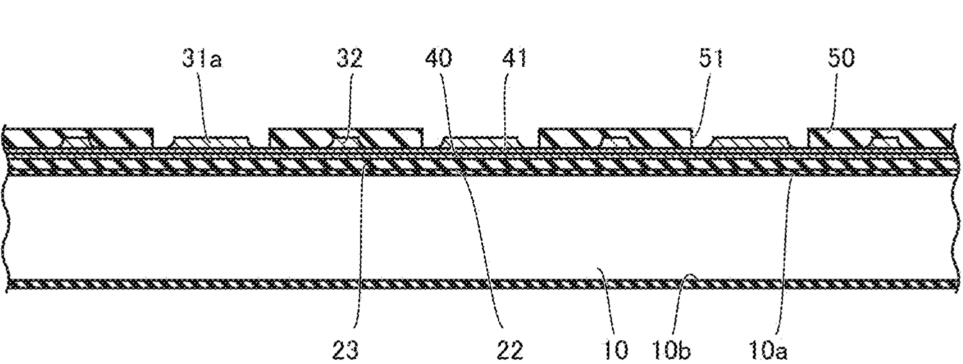
FIG. 3 is a cross-sectional view taken along III-III in FIG. 1.

FIG. 1 is a plan view of thermal print head 100. It is to be noted that FIG. 1 does not show removed portions of individual wirings 31 and common wirings 32. FIG. 2A is a cross-sectional view taken along IIA-IIA in FIG. 1. FIG. 2B is a cross-sectional view taken along IIB-IIB in FIG. 1. FIG. 3 is a cross-sectional view taken along III-III in FIG. 1. As shown in FIGS. 1 to 3, thermal print head 100 has a substrate 10, an insulating layer 20, a wiring layer 30, a resistor layer 40, and a protective layer 50.

A constituent material of substrate 10 is, for example, monocrystalline silicon. Substrate 10 has a first surface 10*a* and a second surface 10*b*. First surface 10*a* and second surface 10*b* are end faces of substrate 10 in a thickness direction. Second surface 10*b* is opposite to first surface 10*a*.

A raised portion 11 is formed on first surface 10*a*. In raised portion 11, first surface 10*a* protrudes toward a side opposite to second surface 10*b*. Raised portion 11 extends along a first direction DR1 in a plan view.

Insulating layer 20 has a first insulating layer 21, a glaze layer 22 and a second insulating layer 23, for example. First insulating layer 21 is formed on first surface 10*a*. First insulating layer 21 is also disposed on second surface 10*b*. A constituent material of first insulating layer 21 is, for example, silicon oxide. Glaze layer 22 is disposed on a top surface of raised portion 11 with first insulating layer 21 interposed therebetween. A constituent material of glaze layer 22 is, for example, glass. Second insulating layer 23 is disposed on first insulating layer 21 to cover glaze layer 22. A constituent material of second insulating layer 23 is, for example, silicon oxide.

Wiring layer 30 is disposed on insulating layer 20 with resistor layer 40 interposed therebetween. A constituent material of wiring layer 30 is, for example, aluminum or an aluminum alloy. A constituent material of resistor layer 40 is, for example, tantalum nitride. An intermediate layer 41 may be interposed between wiring layer 30 and resistor layer 40. A constituent material of intermediate layer 41 is, for example, titanium.

Wiring layer 30 has a plurality of individual wirings 31, a plurality of common wirings 32 and a common electrode 33.

The plurality of individual wirings 31 are arranged along first direction DR1 in a plan view. One ends of individual wirings 31 in a second direction DR2 overlap with raised portion 11 in a plan view. The other ends of individual wirings 31 in second direction DR2 have bonding pads 31*a*. Second direction DR2 is a direction orthogonal to first direction DR1 in a plan view.

In a cross-sectional view orthogonal to second direction DR2, bonding pad 31*a* has an upper surface, a bottom surface, and a side surface continuous to the upper surface and the bottom surface. A width of the bottom surface of bonding pad 31*a* in first direction DR1 is preferably 1.1 times or more as great as a width of the upper surface of bonding pad 31*a* in first direction DR1. It is preferable that aluminum chloride should not substantially exist in the side surface of bonding pad 31*a*. From another point of view, it is preferable that a concentration of aluminum chloride should not be detected in the side surface of bonding pad 31*a*. The concentration of aluminum chloride in the side surface of bonding pad 31*a* is measured by energy dispersive X-ray spectroscopy. A width of bonding pad 31*a* in first direction DR1 is preferably equal to or greater than 100 μm.

The plurality of common wirings 32 are arranged along first direction DR1 in a plan view. Each of common wirings 32 is disposed between two corresponding individual wirings 31 adjacent to each other in first direction DR1. One ends of common wirings 32 in second direction DR2 overlap with raised portion 11 in a plan view. The one ends of common wirings 32 in second direction DR2 are connected to the one ends of individual wirings 31 in second direction DR2, respectively. The other ends of common wirings 32 in second direction DR2 are connected to common electrode 33. Common electrode 33 extends along first direction DR1 in a plan view. A common potential is supplied to common electrode 33.

Each of individual wirings 31 is partially removed at a position where each of individual wirings 31 overlaps with raised portion 11 in a plan view. Intermediate layer 41 and resistor layer 40 are exposed from the removed portion of individual wiring 31. Intermediate layer 41 exposed from the removed portion of individual wiring 31 is partially removed and resistor layer 40 is exposed from the removed portion of intermediate layer 41. Similarly, each of common wirings 32 is partially removed at a position where each of common wirings 32 overlaps with raised portion 11 in a plan view. Intermediate layer 41 and resistor layer 40 are exposed from the removed portion of common wiring 32. Intermediate layer 41 exposed from the removed portion of common wiring 32 is partially removed and resistor layer 40 is exposed from the removed portion of intermediate layer 41.

A constituent material of protective layer 50 is, for example, silicon nitride. Protective layer 50 is disposed on insulating layer 20 to cover wiring layer 30. In the removed portions of individual wirings 31 and the removed portions of common wirings 32, protective layer 50 is also disposed on resistor layer 40 and intermediate layer 41.

An opening 51 is formed in protective layer 50. Opening 51 passes through protective layer 50 along a thickness direction. In a plan view, a width of opening 51 in second direction DR2 is, for example, greater than a width of opening 51 in first direction DR1. In a plan view, the width of opening 51 in first direction DR1 is greater than the width of bonding pad 31*a* in first direction DR1. From another point of view, both ends of bonding pad 31*a* in first direction DR1 are exposed from opening 51.

Figure 4:
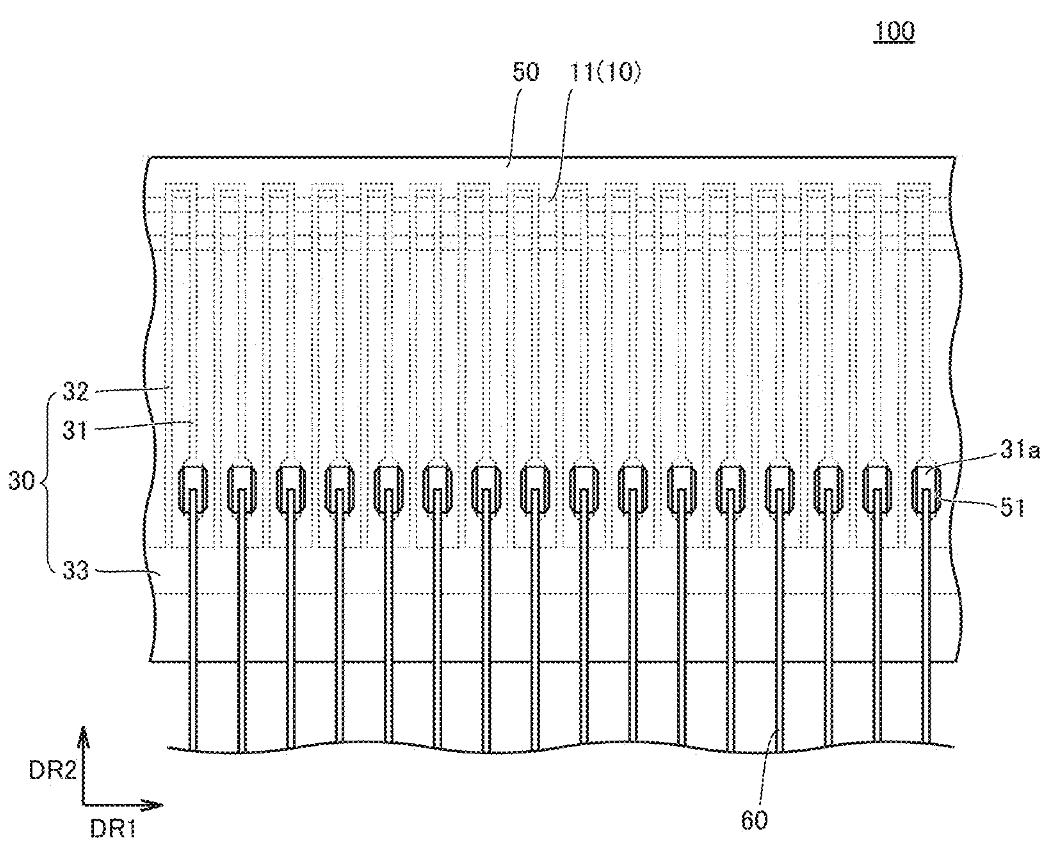
FIG. 4 is a plan view of thermal print head 100 having bonding wires 60 joined thereto.

FIG. 4 is a plan view of thermal print head 100 having bonding wires 60 joined thereto. As shown in FIG. 4, one ends of bonding wires 60 are joined to bonding pads 31*a*. Although not shown, the other ends of bonding wires 60 are joined to bonding pads of a driver integrated circuit (IC). Thus, thermal print head 100 is electrically connected to the driver IC.

The driver IC individually supplies a potential to each of the plurality of individual wirings 31 through bonding wires 60. Thus, a current flows through one individual wiring 31 supplied with the potential and one common wiring 32 connected to this individual wiring 31. In the removed portion of individual wiring 31 and the removed portion of common wiring 32, the current flows through resistor layer 40. As a result, resistor layer 40 exposed from the removed portion of one individual wiring 31 supplied with the potential, and resistor layer 40 exposed from the removed portion of one common wiring 32 connected to this individual wiring 31 generate heat individually and the heat is transferred to a sheet of paper, whereby printing is performed on the sheet of paper.

(Method for Manufacturing Thermal Print Head 100)

A method for manufacturing a thermal print head will be described below.

Figure 5:
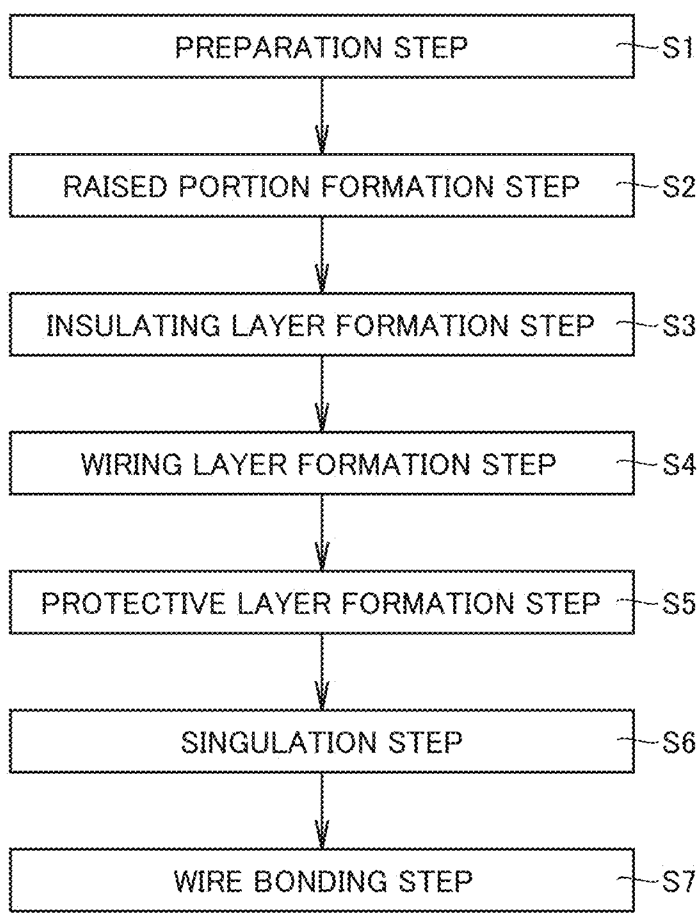
FIG. 5 is a manufacturing process diagram for thermal print head 100.

FIG. 5 is a manufacturing process diagram for thermal print head 100. As shown in FIG. 5, the method for manufacturing thermal print head 100 has a preparation step S1, a raised portion formation step S2, an insulating layer formation step S3, a wiring layer formation step S4, a protective layer formation step S5, and a singulation step S6. In preparation step S1, substrate 10 is prepared. After preparation step S1, raised portion formation step S2 is performed.

Figure 6:
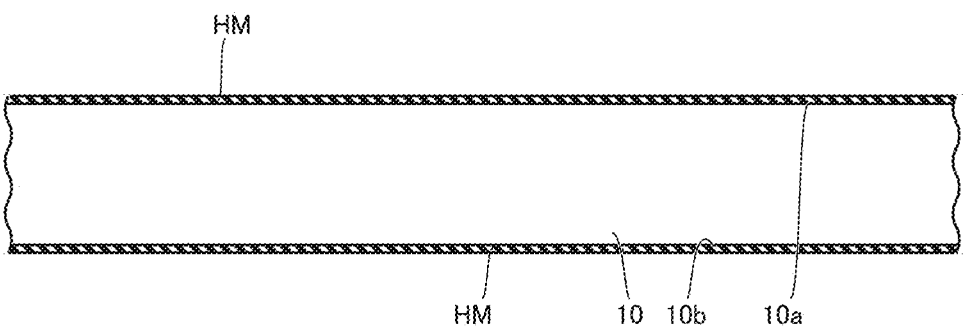
FIG. 6 is a first cross-sectional view illustrating a raised portion formation step S2.
Figure 7:
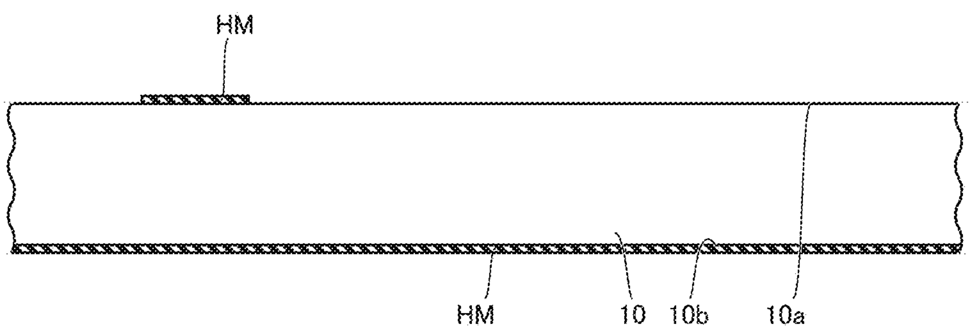
FIG. 7 is a second cross-sectional view illustrating raised portion formation step S2.
Figure 8:
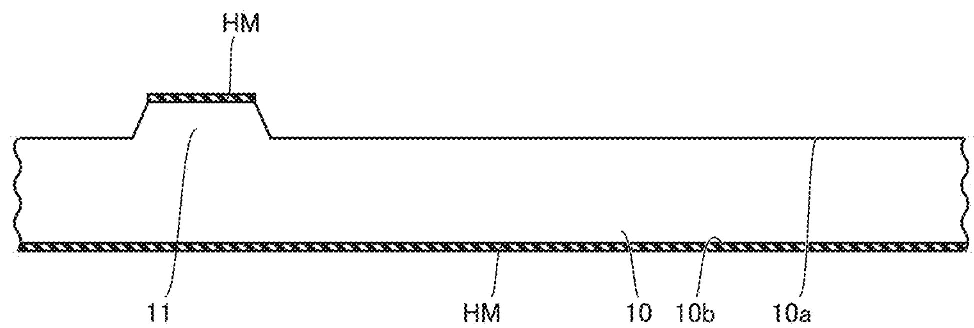
FIG. 8 is a third cross-sectional view illustrating raised portion formation step S2.

In raised portion formation step S2, raised portion 11 is formed on first surface 10*a*. FIG. 6 is a first cross-sectional view illustrating raised portion formation step S2. As shown in FIG. 6, in raised portion formation step S2, firstly, hard masks HM are formed on surfaces of substrate 10. A constituent material of hard mask HM is, for example, silicon nitride. Hard mask HM is formed by, for example, a low-pressure chemical vapor deposition (CVD) method. FIG. 7 is a second cross-sectional view illustrating raised portion formation step S2. As shown in FIG. 7, in raised portion formation step S2, secondly, hard mask HM located on first surface 10*a* is partially removed by reactive ion etching (RIE) using a resist pattern formed by photolithography as a mask. As a result, hard mask HM remains only at a position on first surface 10*a* corresponding to the top surface of raised portion 11. FIG. 8 is a third cross-sectional view illustrating raised portion formation step S2. As shown in FIG. 8, in raised portion formation step S2, thirdly, wet etching using a potassium hydroxide aqueous solution is performed on first surface 10*a*, using hard mask HM as a mask. Although not shown, after this wet etching, hard mask HM is removed by hydrofluoric acid. After raised portion formation step S2, insulating layer formation step S3 is performed.

Figure 9:
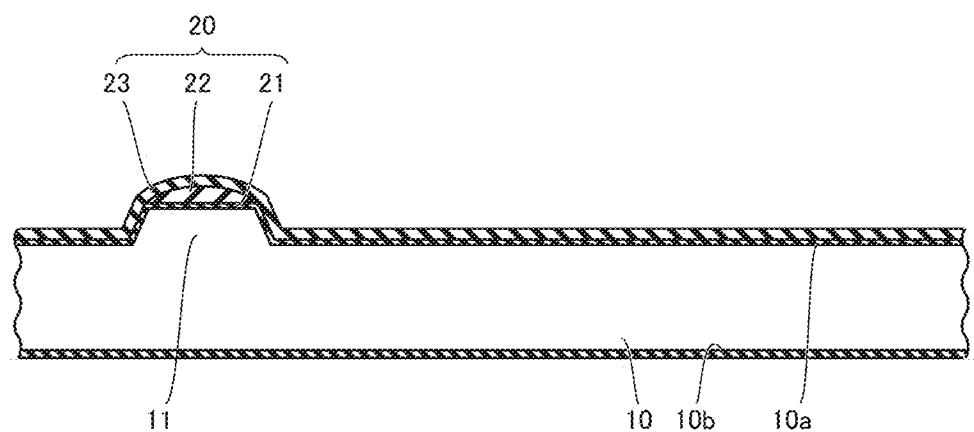
FIG. 9 is a cross-sectional view illustrating an insulating layer formation step S3.

FIG. 9 is a cross-sectional view illustrating insulating layer formation step S3. As shown in FIG. 9, in insulating layer formation step S3, insulating layer 20 is formed. In insulating layer formation step S3, firstly, first insulating layer 21 is formed on the surface of substrate 10 by thermal oxidation. Secondly, glaze layer 22 is formed on the top surface of raised portion 11 with first insulating layer 21 interposed therebetween. Glaze layer 22 is formed by applying a glass-containing paste onto the top surface of raised portion 11 with first insulating layer 21 interposed therebetween, and firing the applied paste. Thirdly, second insulating layer 23 is formed on first insulating layer 21 located on first surface 10*a*, so as to cover glaze layer 22. Second insulating layer 23 is formed by, for example, a plasma CVD method using tetra eth oxy silane (TEOS). After insulating layer formation step S3, wiring layer formation step S4 is performed.

Figure 10:
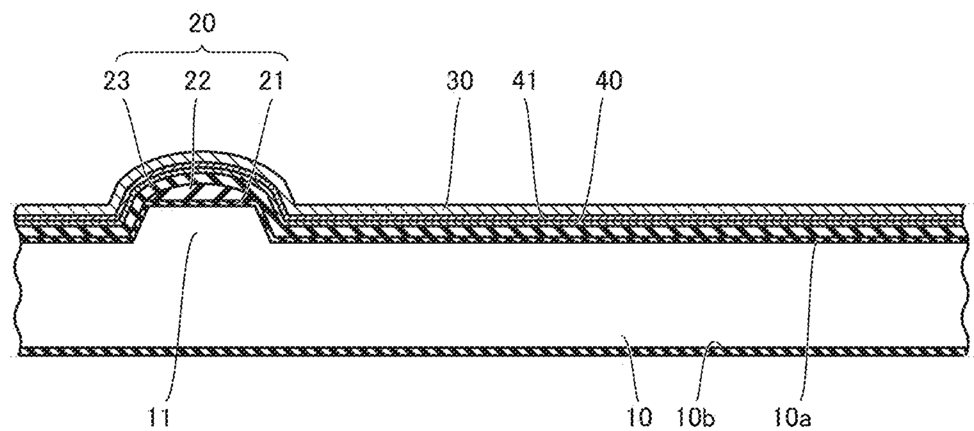
FIG. 10 is a first cross-sectional view illustrating a wiring layer formation step S4.

FIG. 10 is a first cross-sectional view illustrating wiring layer formation step S4. As shown in FIG. 10, in wiring layer formation step S4, firstly, the constituent material of resistor layer 40, the constituent material of intermediate layer 41 and the constituent material of wiring layer 30 are sequentially deposited on insulating layer 20. This deposition is performed by, for example, sputtering.

Figure 11:
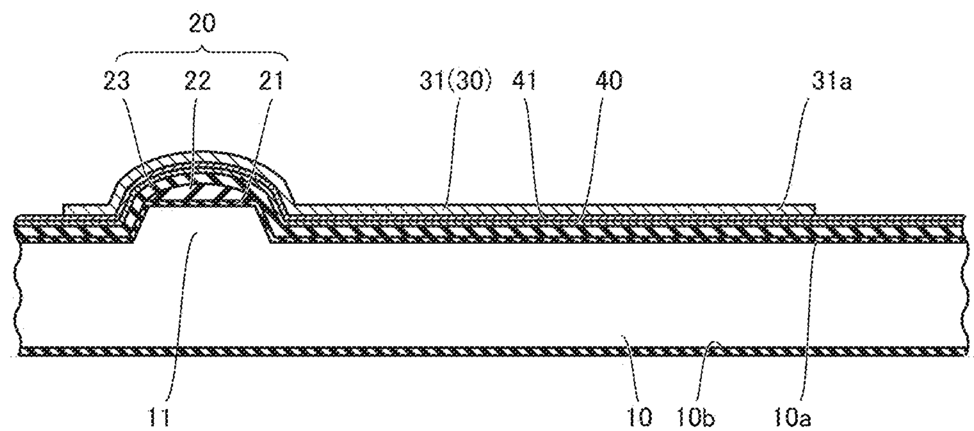
FIG. 11 is a second cross-sectional view illustrating wiring layer formation step S4.

FIG. 11 is a second cross-sectional view illustrating wiring layer formation step S4. As shown in FIG. 11, in wiring layer formation step S4, secondly, the deposited constituent material of wiring layer 30 is patterned by wet etching using a resist pattern formed by photolithography as a mask. Individual wirings 31, common wirings 32 and common electrode 33 are thus formed. At this stage, partial removal of individual wirings 31 and common wirings 32 is not performed. Since wiring layer 30 is patterned by wet etching, the width of the bottom surface of bonding pad 31*a* in first direction DR1 becomes 1.1 times or more as great as the width of the upper surface of bonding pad 31*a* in first direction DR1, and aluminum chloride does not substantially exist in the side surface of bonding pad 31*a*.

Figure 12:
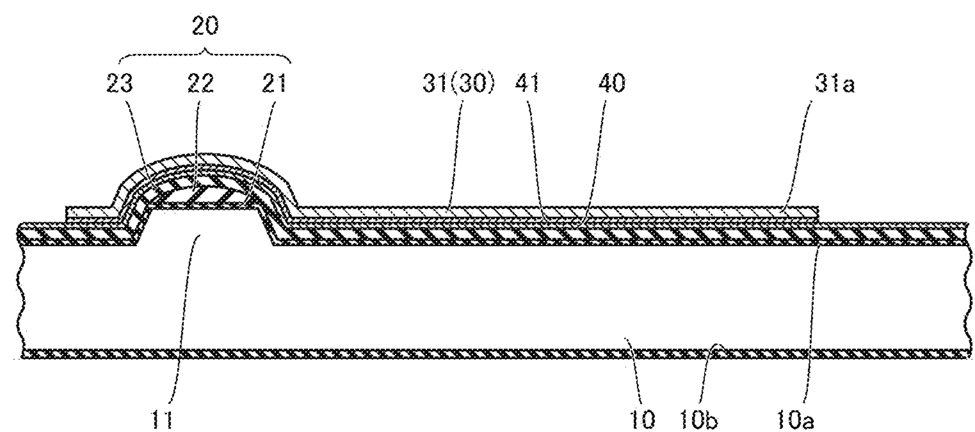
FIG. 12 is a third cross-sectional view illustrating wiring layer formation step S4.
Figure 13:
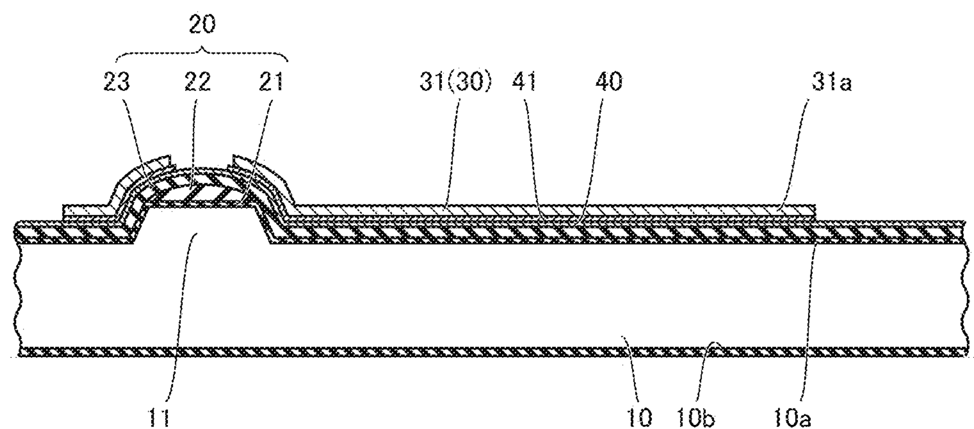
FIG. 13 is a fourth cross-sectional view illustrating wiring layer formation step S4.

FIG. 12 is a third cross-sectional view illustrating wiring layer formation step S4. As shown in FIG. 12, in wiring layer formation step S4, thirdly, the deposited constituent material of intermediate layer 41 is patterned by wet etching using individual wirings 31, common wirings 32 and common electrode 33 as a mask. Intermediate layer 41 is thus formed. FIG. 13 is a fourth cross-sectional view illustrating wiring layer formation step S4. As shown in FIG. 13, in wiring layer formation step S4, fourthly, individual wirings 31 and common wirings 32 located at the positions where individual wirings 31 and common wirings 32 overlap with raised portion 11 in a plan view are partially removed by, for example, wet etching using a resist pattern formed by photolithography as a mask. In addition, with this etching, intermediate layer 41 exposed from the removed portions of individual wirings 31 and the removed portions of common wirings 32 is also partially removed.

Figure 14:
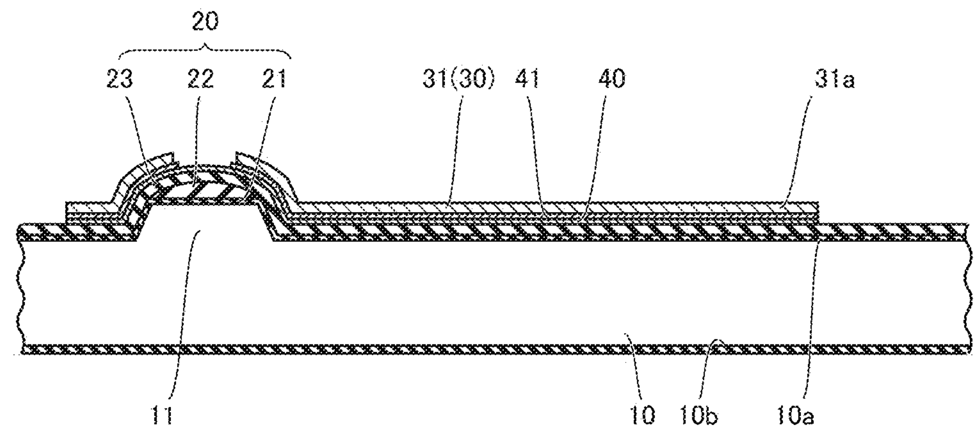
FIG. 14 is a fifth cross-sectional view illustrating wiring layer formation step S4.

FIG. 14 is a fifth cross-sectional view illustrating wiring layer formation step S4. As shown in FIG. 14, in wiring layer formation step S4, the deposited constituent material of resistor layer 40 is patterned by, for example, RIE using a resist pattern formed by photolithography as a mask. At this time, the deposited constituent material of resistor layer 40 is not removed in the removed portions of individual wirings 31 and the removed portions of common wirings 32. After wiring layer formation step S4, protective layer formation step S5 is performed.

Figure 15:
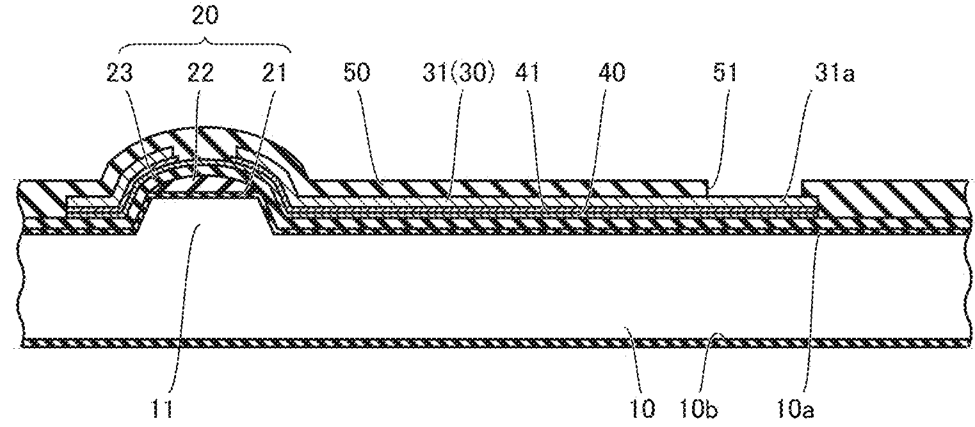
FIG. 15 is a cross-sectional view illustrating a protective layer formation step S5.

FIG. 15 is a cross-sectional view illustrating protective layer formation step S5. As shown in FIG. 15, in protective layer formation step S5, protective layer 50 is formed. In protective layer formation step S5, firstly, protective layer 50 is formed by, for example, the CVD method. Secondly, opening 51 is formed by, for example, RIE using a resist pattern formed by photolithography as a mask, so as to expose bonding pads 31*a*. After protective layer formation step S5, singulation step S6 is performed.

In singulation step S6, substrate 10 is cut. The structure of thermal print head 100 shown in FIGS. 1 to 3 is thus formed.

Thermal print head 100 is subjected to a wire bonding step S7. Wire bonding step S7 is performed using a capillary. Bonding wires 60 are held by the capillary. A diameter of the capillary is preferably larger than the width of bonding pad 31*a* in first direction DR1. A difference between the width of bonding pad 31*a* in first direction DR1 and the diameter of the capillary is preferably equal to or larger than 20 μm.

(Modifications)

In thermal print head 100, the top surface of raised portion 11 may be formed by a plurality of planes. In addition, in thermal print head 100, insulating layer 20 does not need to have glaze layer 22. In this case, in raised portion formation step S2, wet etching using tetramethylammonium hydroxide (TMAH) is performed after wet etching is performed on substrate 10 using the potassium hydroxide aqueous solution. As a result, the top surface of raised portion 11 is configured by a plurality of planes.

(Effects of Thermal Print Head 100)

The effects of thermal print head 100 will be described below in comparison with a comparative example. A thermal print head according to the comparative example will be referred to as a thermal print head 200.

Figure 16:
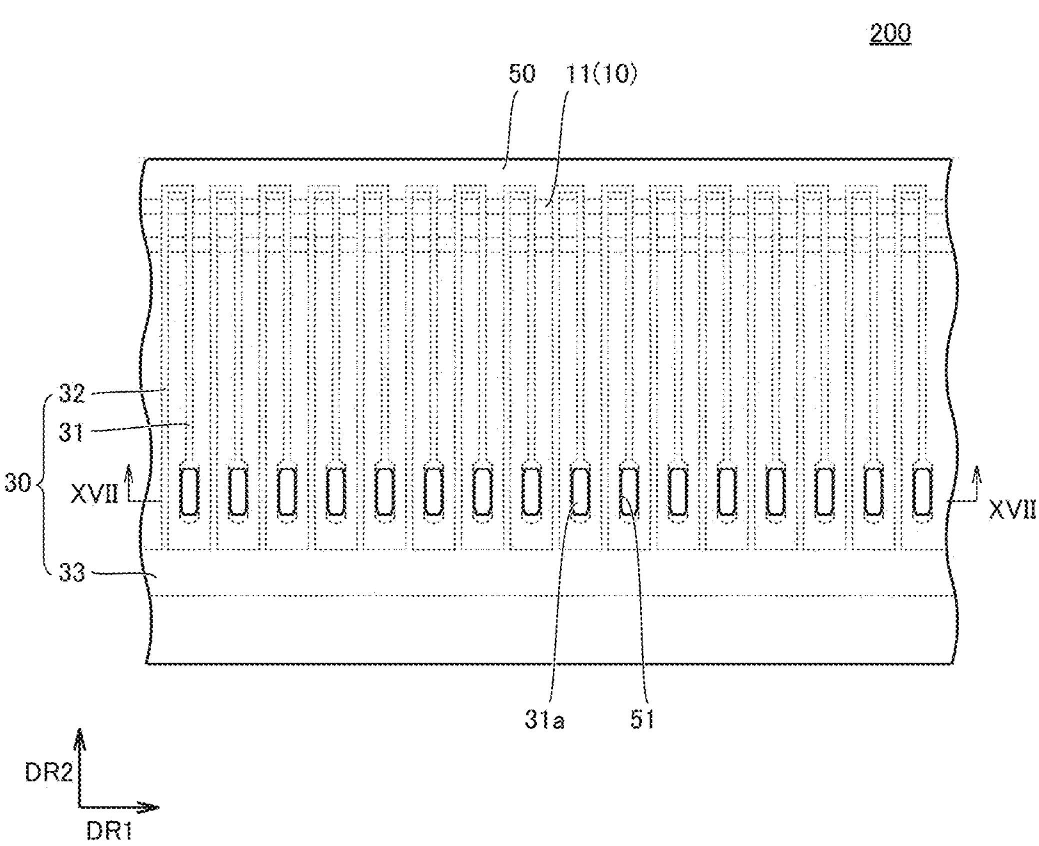
FIG. 16 is a plan view of a thermal print head 200.
Figure 17:
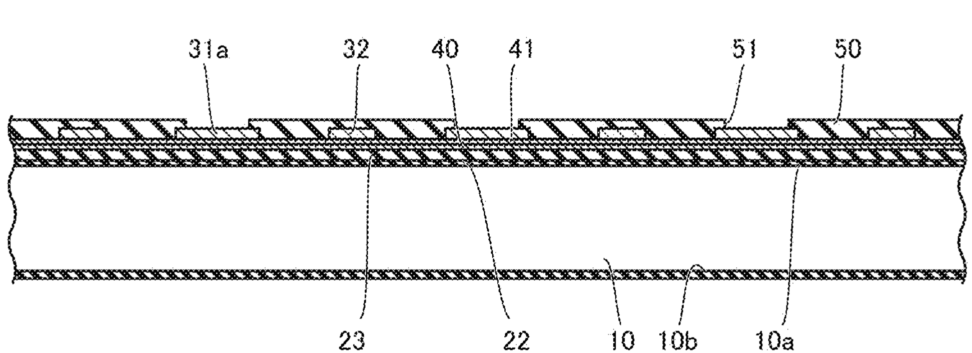
FIG. 17 is a cross-sectional view taken along XVII-XVII in FIG. 17.

FIG. 16 is a plan view of thermal print head 200. FIG. 17 is a cross-sectional view taken along XVII-XVII in FIG. 17. As shown in FIGS. 16 and 17, in thermal print head 200, the width of opening 51 in first direction DR1 is smaller than the width of bonding pad 31*a* in first direction DR1. That is, in thermal print head 200, both ends of bonding pad 31*a* in first direction DR1 are covered with protective layer 50 and bonding pad 31*a* is not completely exposed from opening 51.

In thermal print head 200, the width of the bottom surface of bonding pad 31*a* in first direction DR1 is less than 1.1 times as great as the width of the upper surface of bonding pad 31*a* in first direction DR1 and aluminum chloride remains in the side surface of bonding pad 31*a*. That is, patterning of wiring layer 30 is formed by dry etching using a chlorine gas. In these respects, the configuration of thermal print head 200 is different from the configuration of thermal print head 100.

In thermal print head 200, the upper surface of bonding pad 31*a* is located below the upper surface of protective layer 50 and the width of opening 51 in first direction DR1 is smaller than the width of bonding pad 31*a* in first direction DR1. Therefore, when wire bonding is performed in thermal print head 200, the capillary may come into contact with an opening edge of opening 51, which may lead to poor joining between bonding wire 60 and bonding pad 31*a*.

In thermal print head 100 as well, the upper surface of bonding pad 31*a* is located below the upper surface of protective layer 50. However, in thermal print head 100, the width of opening 51 in first direction DR1 is greater than the width of bonding pad 31*a* in first direction DR1, and thus, the capillary is less likely to come into contact with the opening edge of opening 51 when wire bonding is performed. As described above, according to thermal print head 100, poor wire bonding can be suppressed.

In thermal print head 200, aluminum chloride remains in the side surface of bonding pad 31*a*, and thus, the width of opening 51 in first direction DR1 cannot be made greater than the width of bonding pad 31*a* in first direction DR1. The reason for this is that when the width of opening 51 in first direction DR1 is made greater than the width of bonding pad 31*a* in first direction DR1 in thermal print head 200 (the side surface of bonding pad 31*a* is exposed from protective layer 50), corrosion of bonding pad 31*a* progresses due to an influence of aluminum chloride remaining in the side surface.

(Supplementary Notes)

The present disclosure includes the following features.

<Supplementary Note 1>

A thermal print head comprising:

a substrate;

an insulating layer;

a wiring layer;

a resistor layer; and a protective layer, wherein the substrate has a first surface and a second surface opposite to the first surface, a raised portion protruding toward a side opposite to the second surface and extending along a first direction in a plan view is formed on the first surface, the insulating layer is disposed on the first surface, the wiring layer is disposed on the insulating layer with the resistor layer interposed therebetween, the wiring layer has a bonding pad, a constituent material of the wiring layer is aluminum or an aluminum alloy, the protective layer is disposed on the insulating layer to cover the wiring layer, an opening that exposes the bonding pad is formed in the protective layer, and a width of the opening in the first direction is greater than a width of the bonding pad in the first direction.

<Supplementary Note 2>

The thermal print head according to Supplementary Note 1, wherein the bonding pad has an upper surface and a bottom surface opposite to the upper surface, a width of the bottom surface in a second direction is 1.1 times or more as great as a width of the upper surface in the second direction, and the second direction is orthogonal to the first direction in a plan view.

<Supplementary Note 3>

The thermal print head according to Supplementary Note 1 or 2, wherein in a cross-sectional view orthogonal to a second direction, the bonding pad has an upper surface, a bottom surface opposite to the upper surface, and a side surface continuous to the upper surface and the bottom surface, aluminum chloride is not detected in the side surface, and the second direction is orthogonal to the first direction in a plan view.

<Supplementary Note 4>

The thermal print head according to any one of Supplementary Notes 1 to 3, wherein the width of the opening in the first direction is equal to or greater than 100 μm.

<Supplementary Note 5>

A method for manufacturing a thermal print head, the method comprising:

preparing a substrate having a first surface and a second surface opposite to the first surface;

forming, on the first surface, a raised portion protruding toward a side opposite to the second surface and extending along a first direction in a plan view;

forming an insulating layer on the first surface;

forming a wiring layer on the insulating layer with a resistor layer interposed therebetween; and forming a protective layer on the insulating layer to cover the wiring layer, wherein a constituent material of the wiring layer is aluminum or an aluminum alloy, the wiring layer has a bonding pad, an opening that exposes the bonding pad is formed in the protective layer, and a width of the opening in the first direction is greater than a width of the bonding pad in the first direction.

<Supplementary Note 6>

The method for manufacturing a thermal print head according to Supplementary Note 5, wherein the forming a wiring layer has depositing the constituent material of the wiring layer, and patterning the deposited constituent material of the wiring layer by wet etching using a resist pattern as a mask.

<Supplementary Note 7>

The method for manufacturing a thermal print head according to Supplementary Note 5 or 6, further comprising performing wire bonding on the bonding pad by using a capillary, wherein the width of the opening in the first direction is greater than a diameter of the capillary.

Although the embodiments of the present disclosure have been described, it should be understood that the embodiments disclosed herein are illustrative and non-restrictive in every respect. The scope of the present disclosure is defined by the terms of the claims, and is intended to include any modifications within the scope and meaning equivalent to the terms of the claims.

What is claimed is:

1. A thermal print head comprising:

a substrate;

an insulating layer;

a wiring layer;

a resistor layer; and a protective layer, wherein the substrate has a first surface and a second surface opposite to the first surface, a raised portion protruding toward a side opposite to the second surface and extending along a first direction in a plan view is formed on the first surface, the insulating layer is disposed on the first surface, the wiring layer is disposed on the insulating layer with the resistor layer interposed therebetween, the wiring layer has a bonding pad, a constituent material of the wiring layer is aluminum or an aluminum alloy, the protective layer is disposed on the insulating layer to cover the wiring layer, an opening that exposes the bonding pad is formed in the protective layer, a width of the opening in the first direction is greater than a width of the bonding pad in the first direction, the bonding pad has an upper surface and a bottom surface opposite to the upper surface, a width of the bottom surface in a second direction is 1.1 times or more as great as a width of the upper surface in the second direction, and the second direction is orthogonal to the first direction in a plan view, in a cross-sectional view orthogonal to a second direction, the bonding pad has an upper surface, a bottom surface opposite to the upper surface, and a side surface continuous to the upper surface and the bottom surface, aluminum chloride is not detected at the side surface of the bonding pad when analyzed using energy dispersive X-ray spectroscopy, and the second direction is orthogonal to the first direction in a plan view.

2. The thermal print head according to claim 1, wherein the width of the opening in the first direction is equal to or greater than 100 μm.

3. A method for manufacturing a thermal print head, the method comprising:

preparing a substrate having a first surface and a second surface opposite to the first surface;

forming, on the first surface, a raised portion protruding toward a side opposite to the second surface and extending along a first direction in a plan view;

forming an insulating layer on the first surface;

forming a wiring layer on the insulating layer with a resistor layer interposed therebetween; and forming a protective layer on the insulating layer to cover the wiring layer, wherein a constituent material of the wiring layer is aluminum or an aluminum alloy, the wiring layer has a bonding pad, an opening that exposes the bonding pad is formed in the protective layer, a width of the opening in the first direction is greater than a width of the bonding pad in the first direction, the bonding pad has an upper surface and a bottom surface opposite to the upper surface, a width of the bottom surface in a second direction is 1.1 times or more as great as a width of the upper surface in the second direction, and the second direction is orthogonal to the first direction in a plan view, in a cross-sectional view orthogonal to a second direction, the bonding pad has an upper surface, a bottom surface opposite to the upper surface, and a side surface continuous to the upper surface and the bottom surface, aluminum chloride is not detected at the side surface of the bonding pad when analyzed using energy dispersive X-ray spectroscopy, and the second direction is orthogonal to the first direction in a plan view, and the forming of the wiring layer includes:

depositing the constituent material of the wiring layer, and patterning the deposited constituent material of the wiring layer by wet etching using a resist pattern as a mask.

4. The method for manufacturing a thermal print head according to claim 3, further comprising:

performing wire bonding on the bonding pad by using a capillary, wherein the width of the opening in the first direction is greater than a diameter of the capillary.

* * * * *